United States Patent
Zhou et al.

(10) Patent No.: US 10,224,406 B2
(45) Date of Patent: Mar. 5, 2019

(54) ARRAY SUBSTRATE INCLUDING VERTICAL TFT, AND MANUFACTURING METHOD THEREOF

(71) Applicant: SHENZHEN CHINA STAR OPTOELECTRONICS TECHNOLOGY CO., LTD., Guangdong (CN)

(72) Inventors: Zhichao Zhou, Guangdong (CN); Yulien Chou, Guangdong (CN); Yue Wu, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 151 days.

(21) Appl. No.: 15/325,985

(22) PCT Filed: Oct. 12, 2016

(86) PCT No.: PCT/CN2016/101911
§ 371 (c)(1),
(2) Date: Jan. 12, 2017

(87) PCT Pub. No.: WO2018/040234
PCT Pub. Date: Mar. 8, 2018

(65) Prior Publication Data
US 2018/0219073 A1    Aug. 2, 2018

(30) Foreign Application Priority Data

Aug. 31, 2016 (CN) .......................... 2016 1 0793913

(51) Int. Cl.
*H01L 21/77* (2017.01)
*H01L 27/12* (2006.01)
(Continued)

(52) U.S. Cl.
CPC ........ *H01L 29/41733* (2013.01); *H01L 21/77* (2013.01); *H01L 27/12* (2013.01);
(Continued)

(58) Field of Classification Search
CPC ............ H01L 29/41733; H01L 27/127; H01L 29/41741
(Continued)

(56) References Cited

U.S. PATENT DOCUMENTS 6,320,221 B1 * 11/2001 Choi ..................... G02F 1/1368
257/329
9,613,986 B2 * 4/2017 Li ..................... H01L 29/78642
(Continued)

FOREIGN PATENT DOCUMENTS

| CN | 101626035 A | 1/2010 |
|---|---|---|
| CN | 203026512 U | 6/2013 |

(Continued)

*Primary Examiner* — Robert T Huber
(74) *Attorney, Agent, or Firm* — WPAT, PC

(57) ABSTRACT

A TFT array substrate includes a glass substrate, a buffer layer on the glass substrate, a source electrode, a passivation layer on the buffer layer, a gate electrode on the passivation layer, a gate insulating layer on the passivation layer and the gate electrode, an active layer, and a pixel electrode on the gate insulating layer and the active layer. A first source hole is formed in the buffer layer. The source electrode is disposed in the first source hole. A second source hole is formed in the passivation layer and over the first source hole. The source electrode extends into the second source hole. An active layer mounting hole is formed in the gate insulating layer and over the second source hole. The active layer is in the active layer mounting hole.

13 Claims, 8 Drawing Sheets

(51) Int. Cl.
*H01L 29/417* (2006.01)
*G02F 1/1368* (2006.01)

(52) U.S. Cl.
CPC ........ *H01L 27/127* (2013.01); *H01L 27/1225* (2013.01); *H01L 29/41741* (2013.01); *G02F 1/1368* (2013.01)

(58) Field of Classification Search
USPC .................................. 257/43, 401; 438/156
See application file for complete search history.

(56) References Cited

U.S. PATENT DOCUMENTS

| | | | |
|---|---|---|---|
| 2010/0006851 A1* | 1/2010 | Park | ................. H01L 29/41733 257/72 |
| 2011/0101355 A1 | 5/2011 | Yamazaki | |
| 2011/0129968 A1 | 6/2011 | Park | |
| 2016/0204267 A1* | 7/2016 | Moon | ................. H01L 29/7869 257/43 |
| 2016/0247840 A1* | 8/2016 | Li | .................... H01L 29/78642 |
| 2018/0108782 A1 | 4/2018 | Zhou et al. | |

FOREIGN PATENT DOCUMENTS

| | | |
|---|---|---|
| CN | 105390509 A | 3/2016 |
| CN | 105789120 A | 7/2016 |
| WO | 2011052413 A1 | 5/2011 |

* cited by examiner

ARRAY SUBSTRATE INCLUDING VERTICAL TFT, AND MANUFACTURING METHOD THEREOF

FIELD OF THE INVENTION

The present invention relates to a liquid crystal panel technology, and more particularly to a TFT array substrate, a manufacturing method, and a display apparatus thereof.

BACKGROUND OF THE INVENTION

A TFT (Thin Film Transistor) is also known as a thin film field effect transistor. A TFT-LCD (Thin Film Transistor Liquid Crystal Display) is also known as a thin film field effect transistor liquid crystal display. Each pixel on this type of liquid crystal display is driven by the thin film transistor integrated therebehind, which has a high response speed, high brightness, high contrast, small size, low power consumption, no radiation, etc., and dominates in the current display market.

The main structure of a TFT-LCD includes a TFT array substrate, a color film substrate, and a liquid crystal layer filled between these two substrates. In the conventional TFT-LCD technology, generally, the bottom gate structure of the array substrate is used. The on-state current on the array substrate of this type of TFT-LCD is proportional to the channel width W, and inversely proportional to the channel length L. The magnitude of the on-state current substantially depends on the size of the width-length ratio of the channel, W/L. Under the conventional processing manner, the channel length L of the TFT is mostly equivalent to the distance between the source electrode and the drain electrode, generally at least 4-5 um. Increasing the channel width W will sacrifice the aperture ratio to a certain extent, so that the on-state current in the TFT cannot be too high, and the display effect of the TFT-LCD is limited. Therefore, in the field of TFT-LCD technology, it is quite important to develop a novel TFT structure greatly increasing W/L without sacrificing the aperture ratio or even increasing the aperture ratio.

SUMMARY OF THE INVENTION

An object of the present invention is to provide a TFT array substrate, a method for manufacturing the TFT array substrate, and a display device including the TFT array substrate, for solving the technical problem that the on-state current is low and difficult to control in the prior art, and the technical problem that increasing the on-state current reduces the aperture ratio in the prior art.

To achieve the above object, the present invention provides a TFT array substrate, comprising: a glass substrate; a buffer layer bonded onto the glass substrate and covering the entire glass substrate; a passivation layer bonded onto the buffer layer and covering the entire buffer layer; a source electrode disposed in the buffer layer and the passivation layer; a gate insulating layer disposed on the source electrode and covering the entire passivation layer; an active layer disposed in the gate insulating layer and located above the source electrode; a gate electrode disposed in the gate insulating layer and bonded onto the passivation layer; and a pixel electrode bonded onto the gate insulating layer and the active layer.

Furthermore, a first source hole is formed in the buffer layer; a second source hole is formed in the passivation layer and positioned directly over the first source hole; the source electrode is positioned in the first source hole and the second source hole, and a shape of the source electrode corresponds to shapes of the first source hole and the second source hole.

Furthermore, an active layer mounting hole is formed in the gate insulating layer and positioned directly over the second source hole; the active layer is positioned in the active layer mounting hole, and a shape of the active layer corresponds to a shape of the active layer mounting hole.

Furthermore, the gate insulating layer is coated on the upper surface and a side surface of the gate electrode, and a lower surface of the gate electrode contacts the passivation layer.

Furthermore, at least one data line is embedded in the buffer layer and connected to the source electrode, and at least a source and/or drain line is embedded in the active layer, and connected to the source electrode and/or the pixel electrode.

Furthermore, the active layer is made of amorphous silicon, IGZO or polycrystalline silicon, and the pixel electrode is an ITO electrode or a MoTi (MoTi alloy) electrode.

To achieve the above object, the present invention provides a display device comprising a TFT array substrate as described above.

To achieve the above object, the present invention provides a method of manufacturing a TFT array substrate, comprising steps of: forming a buffer layer on the glass substrate and bonding the buffer layer onto the glass substrate, wherein a first source hole is formed in the buffer layer; disposing a source electrode in the first source hole; disposing a passivation layer on the buffer layer and bonding the passivation layer onto the buffer layer, wherein a second source hole is formed in the passivation layer, and is positioned directly over the first source hole, and the source electrode is positioned in the second source hole; disposing a gate electrode on the passivation layer and bonding the gate electrode onto the passivation layer; disposing a gate insulating layer on the passivation layer and the gate electrode and bonding the gate insulating layer onto the passivation layer and the gate electrode, wherein an active layer mounting hole is formed in the gate insulating layer and positioned directly over the second source hole; forming an active layer in the active layer mounting hole; disposing a pixel electrode on the gate insulating layer and the active layer.

Furthermore, in the step of forming the buffer layer on the glass substrate, at least one data line is embedded in the buffer layer.

Furthermore, in the step of forming an active layer in the active layer mounting hole, at least a source line is embedded in the active layer, and connected to the source electrode.

Furthermore, in the step of forming an active layer in the active layer mounting hole, at least a drain line is embedded in the active layer, and in the step of disposing a pixel electrode, the pixel electrode is connected to the drain line.

The advantages of the present invention is to provide a design solution of a TFT array substrate in which the gate electrode is disposed between the source electrode and the pixel electrode, the channel length of the thin film transistor is equivalent to the thickness of the active layer, and the channel length of the is reduced by reasonably reducing the thickness of the active layer, thereby increasing the on-state current in the thin film transistor, and improving the property of the TFT array substrate and the display effect of the liquid crystal display.

BRIEF DESCRIPTION OF THE DRAWINGS

In FIG. 1-FIG. 13, the components in the figures are referred to as follows:

Figure 1:
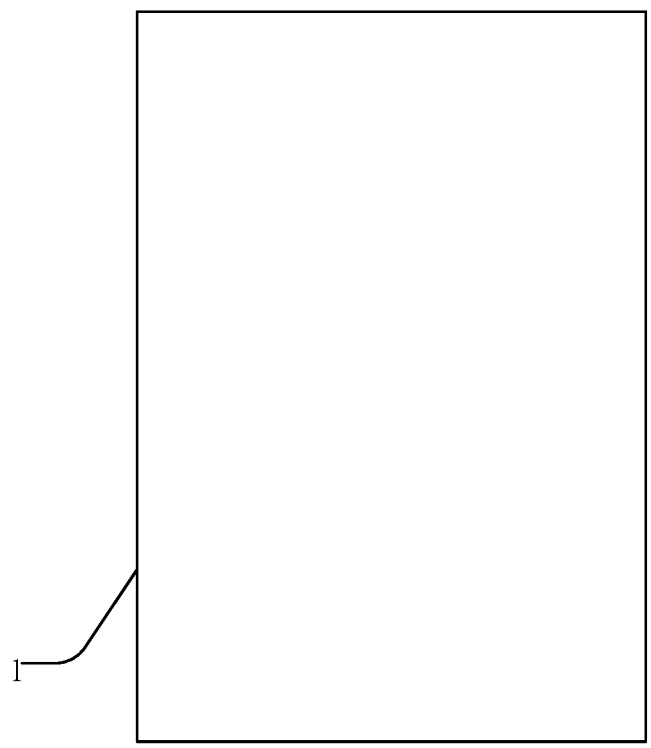
FIG. 1 is a structural schematic diagram of a glass substrate in accordance with an embodiment of the present invention.

1. glass substrate, 2. buffer layer, 3. passivation layer, 4. source electrode, 5. gate insulating layer, 6. active layer, 7. gate electrode, 8. pixel electrode, 21. first source hole, 31. second source hole, 51. active layer mounting hole.

DETAILED DESCRIPTION OF THE PREFERRED EMBODIMENTS

A preferred embodiment of the present invention will now be described by way of example with reference to the accompanying drawings in which the present invention is proven to be practicable. This embodiment introduces the present invention to those skilled in the art, and makes the technical content thereof clearly and easily understood. The present invention may be embodied in many different forms of embodiments, and the scope of the invention is not limited to the embodiments set forth herein.

In the drawings, components having the same structure are denoted by the same reference numbers, and components having similar structures or functions are denoted by similar reference numbers. The dimensions and thicknesses of each of the components shown in the drawings are arbitrarily shown. The present invention is not limited to the size and thickness of each component. In order to make the illustration clearer, the thicknesses of some parts of the component in the drawings are appropriately augmented.

The following description of the embodiments with reference to the accompanying drawings is used to illustrate particular embodiments of the present invention. The directional terms referred in the present invention, such as "upper", "lower", "front", "back", "left", "right", "inner", "outer", "side", etc. are only directions with regard to the accompanying drawings. Therefore, the directional terms used for describing and illustrating the present invention are not intended to limit the present invention.

When a certain component is described as being on/above/over another component, the component may be placed directly on the other component, or there may also be an intermediate component, the component is placed on/above/over the intermediate component, and the intermediate component is placed on/above/over the other component. When a component is described as being disposed on or connected to another component, it may understood that the component is directly disposed on or connected to the other component, or the component is disposed on or connected to the other component via a intermediate component.

As shown in FIG. 1 to FIG. 13, the present embodiment provides a TFT array substrate mainly including the following components.

The TFT array substrate includes a glass substrate 1, as shown in FIG. 1, and the glass substrate 1 may also be referred to as a substrate, which is commonly a glass plate in a liquid crystal display (LCD) structure.

Figure 2:
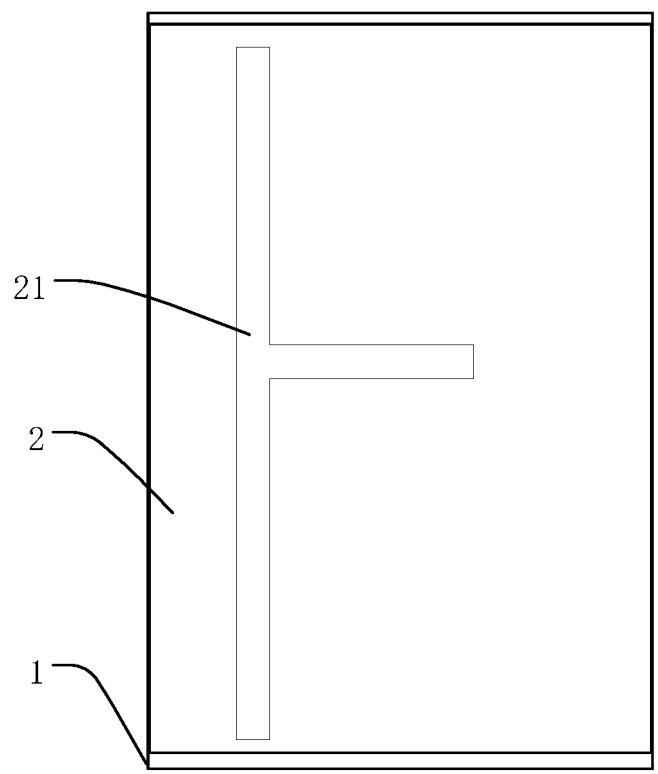
FIG. 2 is a structural schematic diagram of a buffer layer disposed on the glass substrate in accordance with an embodiment of the present invention.

The TFT array substrate includes a buffer layer 2, as shown in FIG. 2, which is bonded onto the glass substrate 1 and covers the entire glass substrate 1. The buffer layer 2 is provided with a first source hole 21 for mounting a source electrode 4 therein. In this embodiment, the first source hole 21 is T-shaped. At least one data line (not shown) is embedded in the buffer layer 2, the data line is entirely embedded in the buffer layer 2 for making the surface of the buffer layer 2 flat, so that the layer subsequently formed on the buffer layer 22 does not need to extend upwardly. At the same time, the data line is made from a metal material(s), embedded in the buffer layer, and may prevent oxidation of the metal wire(s). The patterns of the buffer layer and the data line are exactly the same, so there is no need to add a photomask. The buffer layer 2 is made from an insulating material with a certain flexibility.

Figure 3:
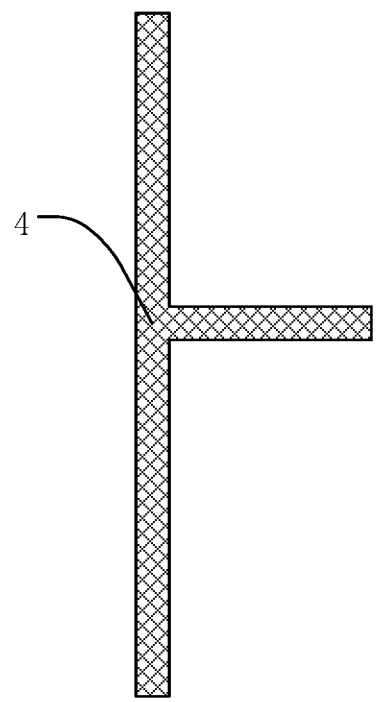
FIG. 3 is a structural schematic diagram of a source electrode in accordance with an embodiment of the present invention.
Figure 4:
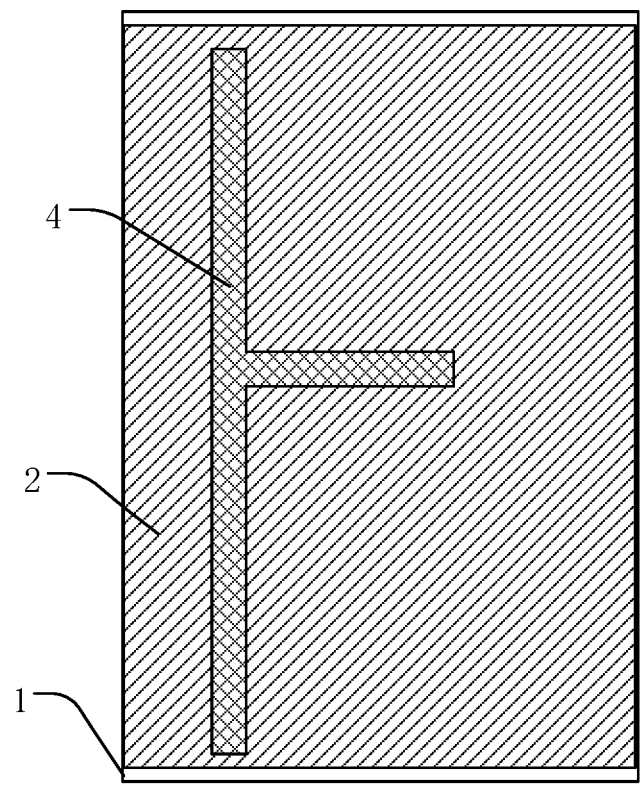
FIG. 4 is a structural schematic diagram of the source electrode disposed on a buffer layer in accordance with an embodiment of the present invention.

As shown in FIG. 3, the TFT array substrate includes a source electrode 4 disposed in the buffer layer 2, and more specifically, the source electrode 4 is positioned in the first source hole 21, as shown in FIG. 4. In this embodiment, the shape of the source electrode 4 corresponds the shape of the first source hole 21, and both are T-shaped. The data line in the buffer layer 2 is connected to the source electrode 4.

Figure 5:
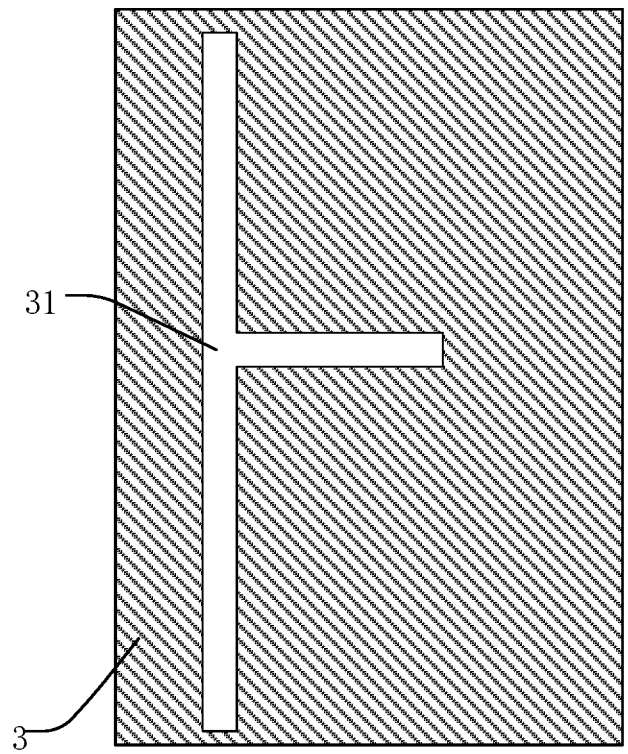
FIG. 5 is a structural schematic diagram of a passivation layer in accordance with an embodiment of the present invention.
Figure 6:
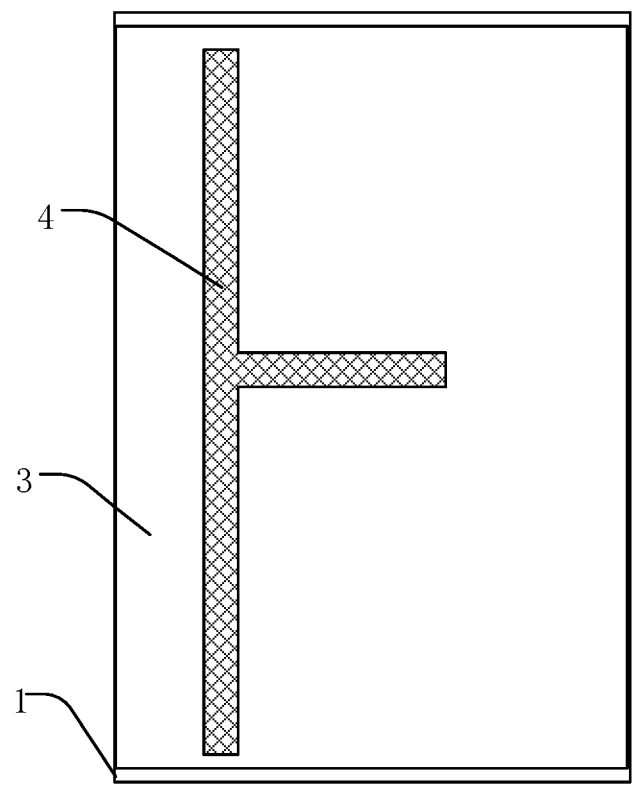
FIG. 6 is a structural schematic diagram of the passivation layer disposed on the buffer layer in accordance with an embodiment of the present invention.

As shown in FIG. 5, the TFT array substrate includes a passivation layer 3. As shown in FIG. 6, the passivation layer 3 is bonded onto the buffer layer 2 and covers the entire buffer layer 2. The passivation layer 3 is provided with a second source hole 31 positioned directly over the first source hole 21. The shape of the second source hole 31 corresponds to the first source hole 21, and both are T-shaped. The passivation layer 3 is generally made of a silicon nitride material. The source electrode 4 is also positioned in the passivation layer 3, and in particular, the source electrode 4 is also positioned in the second source hole 31.

Figure 7:
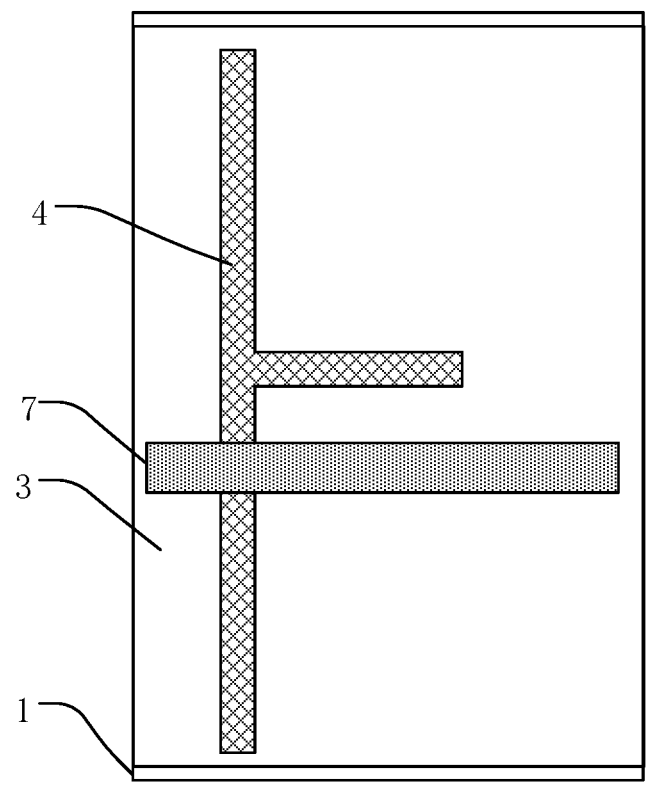
FIG. 7 is a structural schematic diagram of a gate electrode disposed on the passivation layer in accordance with an embodiment of the present invention.

As shown in FIG. 7, the TFT array substrate includes a gate electrode 7 bonded onto the passivation layer 3, and the lower surface of the gate electrode 7 directly contacts the passivation layer 3.

Figure 8:
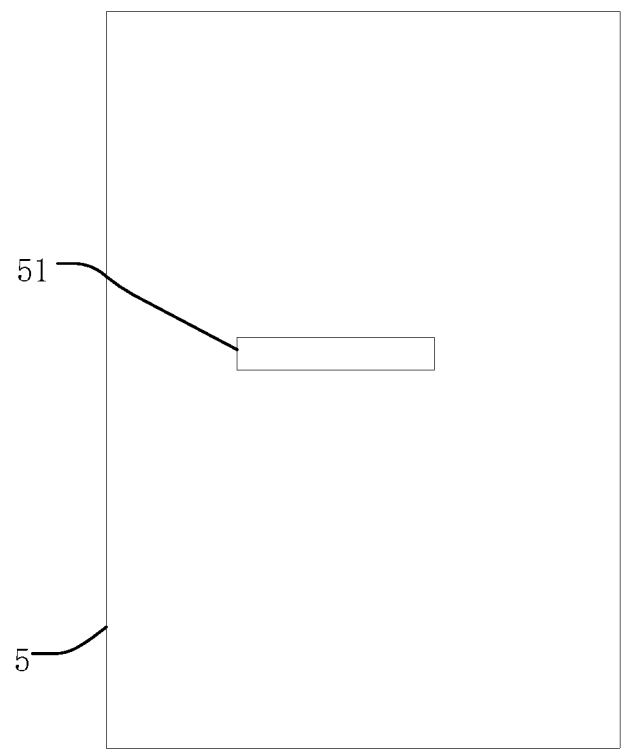
FIG. 8 is a structural schematic diagram of a gate insulating layer in accordance with an embodiment of the present invention.
Figure 9:
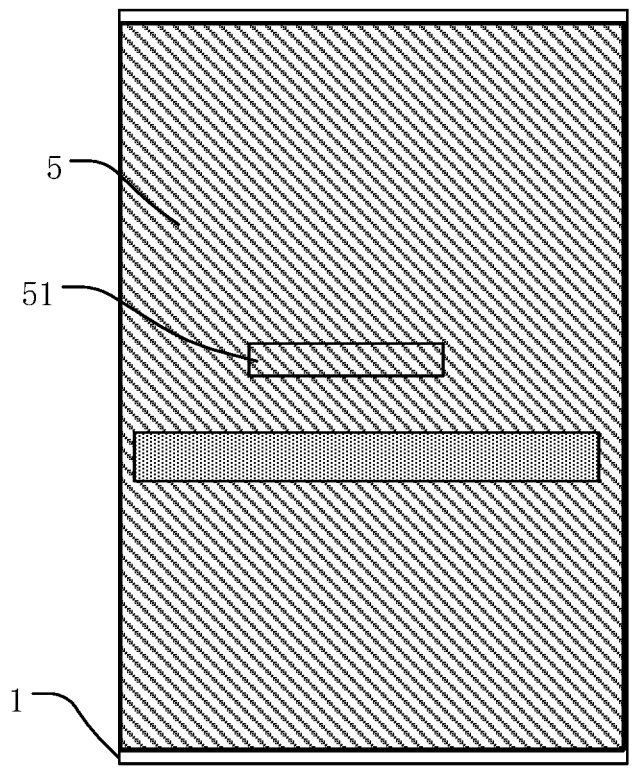
FIG. 9 is a structural schematic diagram of the gate insulating layer disposed on the passivation layer in accordance with an embodiment of the present invention.

As shown in FIG. 8 and FIG. 9, the TFT array substrate includes a gate insulating layer 5. The gate insulating layer 5 overlaps the source electrode 4, and covers the entire passivation layer 3. The gate electrode 7 is disposed in the gate insulating layer 5, and the gate insulating layer 5 covers the upper surface and the side surface of the gate electrode 7. The gate insulating layer 5 is provided with an active layer mounting hole 51 and the active layer mounting hole 51 is positioned directly over the second source hole 31.

Figure 10:
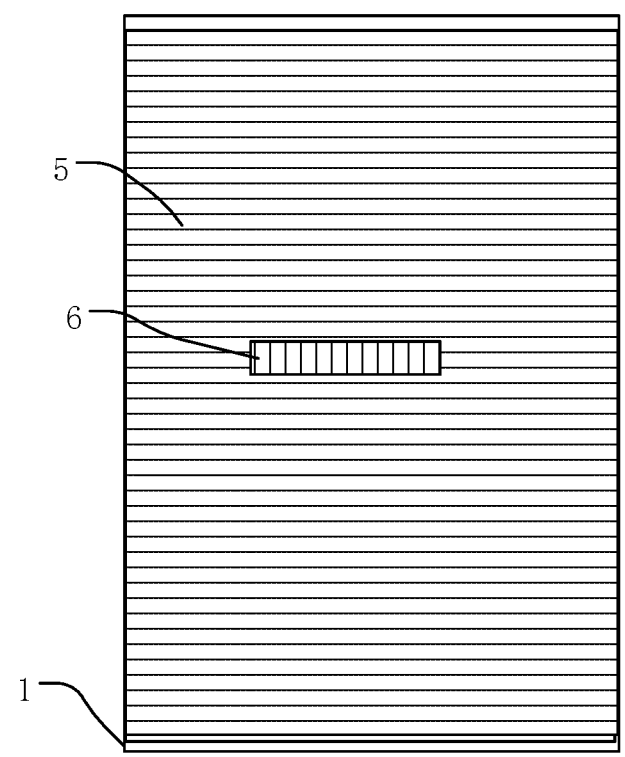
FIG. 10 is a structural schematic diagram of an active layer disposed in the gate insulating layer in accordance with an embodiment of the present invention.

As shown in FIG. 10, the TFT array substrate includes an active layer 6 disposed in the gate insulating layer 5 and positioned on the source electrode 4. The active layer 6 is positioned in the active layer mounting hole 51, and the shape of the active layer 6 corresponds to the shape of the active layer mounting hole 51. The active layer material can be amorphous silicon, IGZO or polysilicon, and so on. If the active layer is made of amorphous silicon, it can be formed by directly growing n+amorphous silicon through chemical vapor deposition (CVD), whereby there is no need for a dry etching process to cut off the n+amorphous silicon. At least one source and/or drain line (not shown) is embedded in the active layer 6, and connected to the source electrode 4 and/or a pixel electrode 8.

Figure 11:
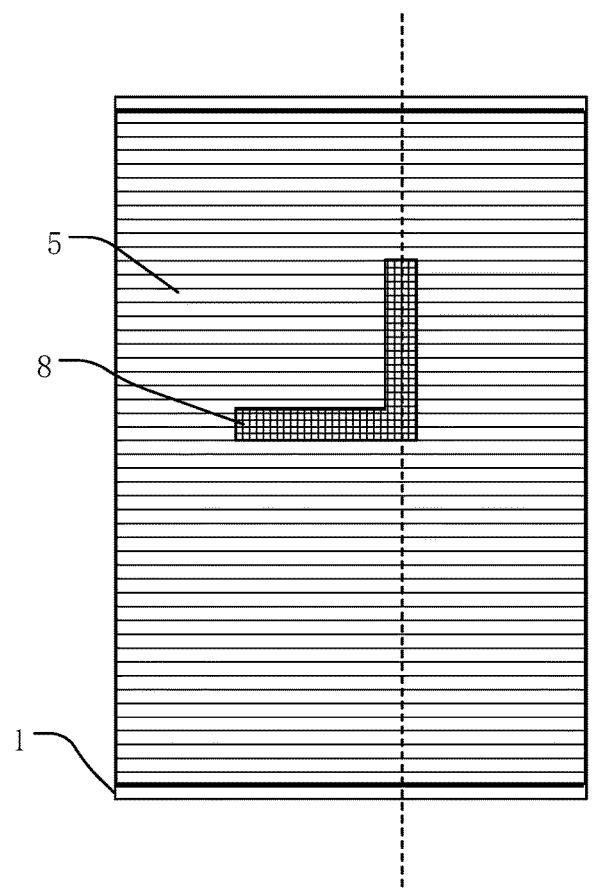
FIG. 11 is a structural schematic diagram of a pixel electrode disposed on the gate insulating layer in accordance with an embodiment of the present invention.
Figure 12:
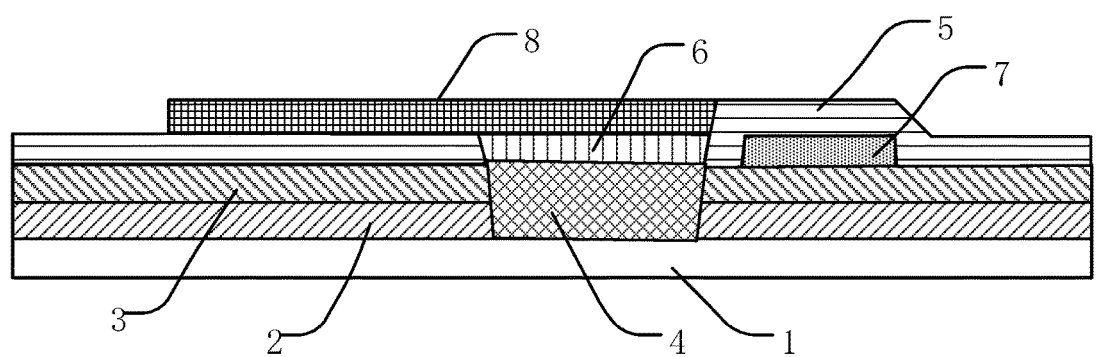
FIG. 12 is a cross-sectional view taken along the dotted line in FIG. 11.
Figure 13:
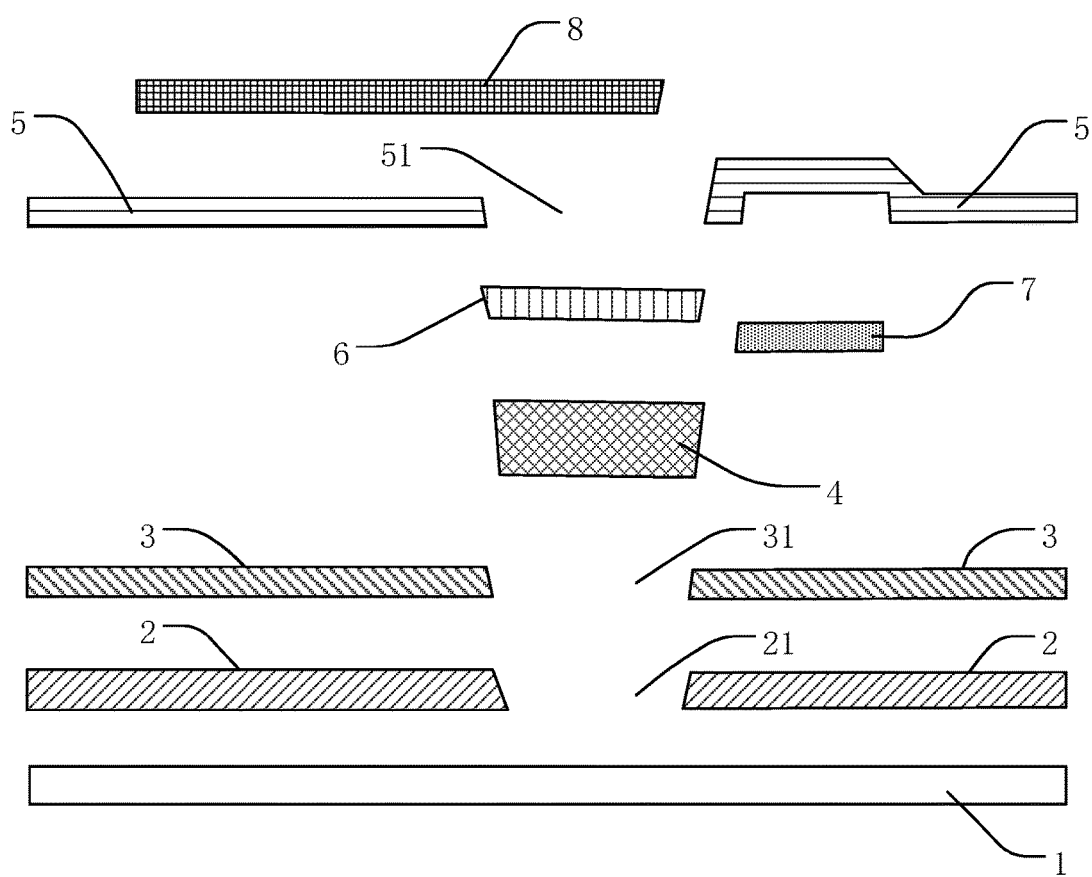
FIG. 13 is an exploded schematic diagram of the components in FIG. 12 after disassembly.

As shown in FIG. 11, the TFT array substrate includes the pixel electrode 8 bonded onto the gate insulating layer 5 and the active layer 6. In this embodiment, the pixel electrode 8 itself may serves as the drain electrode, and the pixel electrode 8 is preferably an ITO (indium tin oxide) electrode or a MoTi (MoTi alloy) electrode. FIG. 12 and FIG. 13 show the TFT array substrate of the present embodiment. FIG. 12 shows a cross-sectional view taken along the dotted line in FIG. 11. FIG. 13 shows an exploded schematic diagram of the components in FIG. 12 after disassembly.

Figure 14:
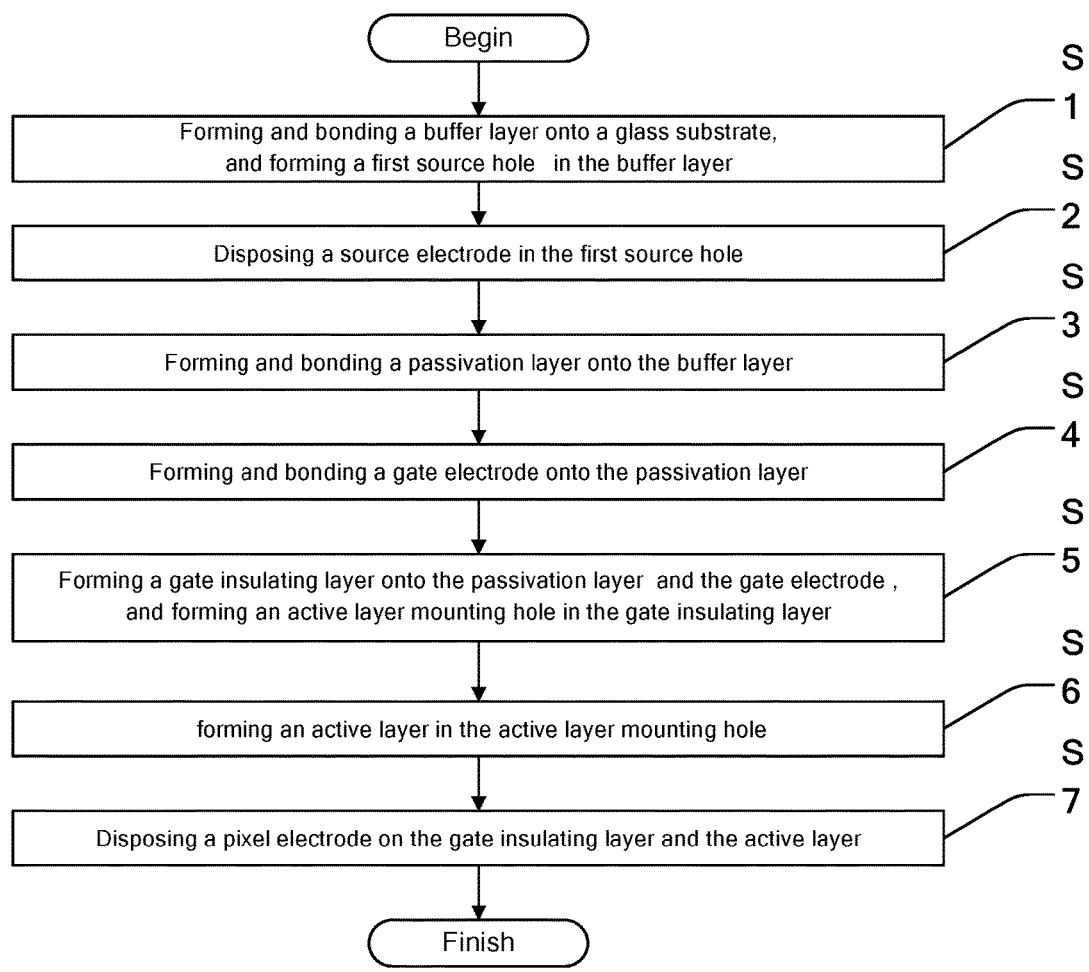
FIG. 14 is a flowchart of a method of manufacturing a TFT array substrate in accordance with the embodiment of the present invention.

As shown in FIG. 14, the present embodiment provides a method for manufacturing a TFT array substrate, and specifically includes the following steps:

In Step S1, a buffer layer 2 is formed on a glass substrate 1, and bound onto the glass substrate 1, and a first source hole 21 is formed in the buffer layer 2. In the process of forming the buffer layer 2, at least one data line (not shown) is embedded in the buffer layer 2, the data line is entirely embedded in the buffer layer 2 for making the surface of the buffer layer 2 flat, so that the layer subsequently formed on the buffer layer 22 does not need to extend upwardly. At the same time, the data line is made from a metal material(s), embedded in the buffer layer, and may prevent oxidation of a metal wire(s). The patterns of the buffer layer and the data line are exactly the same, so there is no need to add a photomask. The buffer layer 2 is made from an insulating material with certain flexibility.

In Step S2, as shown in FIG. 4, a source electrode 4 is disposed in the first source hole 21. The shape of the source electrode 4 corresponds the shape of the first source hole 21, and both are T-shaped. The data line in the buffer layer 2 is connected to the source electrode 4.

In Step S3, as shown in FIG. 6, a passivation layer 3 is formed on the buffer layer 2. The passivation layer 3 is generally made of a silicon nitride material, and is bonded onto the buffer layer 2 and covers the entire buffer layer 2. A second source hole 31 is formed in the passivation layer 3 and positioned directly over the first source hole 21. The shape of the second source hole 31 corresponds to the first source hole 21, and both are T-shaped. The source electrode 4 is also positioned in the second source hole 31.

In Step S4, as shown in FIG. 7, a gate electrode 7 is disposed on the passivation layer 3, and bonded onto the passivation layer 3, and the lower surface of the gate electrode 7 directly contacts the passivation layer 3.

In Step S5, as shown in FIG. 9, a gate insulating layer 5 is formed on the passivation layer 3 and the gate electrode 7. The gate insulating layer 5 overlaps the source electrode 4, is bonded onto the passivation layer 3 and the gate electrode 7, and covers the entire passivation layer 3. The gate electrode 7 is disposed in the gate insulating layer 5, and the gate insulating layer 5 covers the upper surface and the side surface of the gate electrode 7. The gate insulating layer 5 is provided with an active layer mounting hole 51 and the active layer mounting hole 51 positioned directly over the second source hole 31.

In Step S6, as shown in FIG. 10, an active layer 6 is formed in the active layer mounting hole 51, disposed in the gate insulating layer 5, and positioned on the source electrode 4. The active layer 6 is positioned in the active layer mounting hole 51, and the shape of the active layer 6 corresponds to the shape of the active layer mounting hole 51. The active layer material can be amorphous silicon, IGZO or polysilicon, and so on. If the active layer is made of amorphous silicon, it can be formed by directly growing n+amorphous silicon through chemical vapor deposition (CVD), whereby there is no need for a dry etching process to cut off the n+amorphous silicon. At least one source and/or drain line (not shown) is embedded in the active layer 6, and is connected to the source electrode 4 and/or the pixel electrode 8.

In Step S7, a pixel electrode 8 is disposed on the gate insulating layer 5 and the active layer 6. In this embodiment, the pixel electrode 8 has an L shape, and the pixel electrode 8 may be connected to a drain line (not shown) embedded in the active layer 6. In the present embodiment, the pixel electrode is served as the drain electrode, mainly due to the consideration of the problem of the junction of the drain electrode and the semiconductor active layer. Commonly used materials for source electrodes and drain electrodes are Mo/Al/Cu. The work functions thereof are basically constant, not adjustable, and are respectively 4.6/4.3/4.65 ev. Commonly used pixel electrodes are ITO (indium tin metal oxide) electrodes or MoTi (Mo—Ti alloy) electrodes. The work functions thereof are ranged from 4.5 to 5.1 eV, and the value is adjustable through a modified treatment of the material for forming the pixel electrode. Therefore, under the premise of the introduction of an n+amorphous silicon layer as the active layer, the ohmic contact between the pixel electrode and the semiconductor active layer is not a problem, and the adjustability thereof makes the process more malleable. In addition, the deposition of the Mo/Al/Cu source and drain electrodes often requires heating to 100-220° C. or higher, and the high temperature material may damage the active layer to a certain extent. However, since the ITO material is used in the present embodiment which requires low power during the deposition process, the ITO deposition can be achieved at room temperature, thereby reducing the energy consumption in the process. Since the ITO material has the advantages of low deposition power and low temperature, when the ITO material is deposited onto the active layer, the damage to the active layer is relatively low. The pixel electrode is directly used as the drain electrode, thereby also reducing the number of holes, reducing the impedance, and enhancing the charging rate.

In the present embodiment, the gate electrode 7 is disposed between the source electrode 4 and the pixel electrode 8. The distance between the source electrode 4 and the pixel electrode 8 is the thickness of the active layer, so the designer can control the channel length by adjusting the thickness of the active layer 6. As shown in FIG. 3, the lateral length of the source electrode 4 in the horizontal direction is the length of the source electrode 4. As shown in FIG. 10, the overlapped portion of the semiconductor active layer 6 and the source electrode 4 is the width of the channel. In the present embodiment, the width of the channel is equivalent to the length of the source electrode 4, so that the designer can adjust the channel width by adjusting the length of the source electrode 4. Specifically, the length of the source electrode 4 is increased, and the overlapped portion of the semiconductor active layer 6 on the source electrode 4 is also increased, so that the channel width is increased. Compared with the conventional bottom-gate and top-gate structures, the designer can easily control the width-length ratio of the channel and the magnitude of the on-state current, for obtaining a much larger channel width-length ratio (W/L) and a much higher on-state current than the conventional bottom-gate TFT design.

In this embodiment, since the same photomask can be used for depositing the gate insulating layer (GI), the passivation layer (PV) and the active layer, it is not necessary to increase the number of photomasks in the manufacturing process.

As compared with the conventional bottom-gate structure, it is not required for the active layer 6 to be deposited on the gate electrode, and the gate electrode 7 is positioned on the same level as the active layer 6, thereby reducing the area of the gate electrode and increasing the aperture ratio.

The present embodiment also provides a display apparatus including the above-mentioned TFT array substrate for obtaining a higher on-state current, thereby obtaining a better display effect.

The technical effect of the present invention is to provide a design solution of a TFT array substrate in which the gate electrode is disposed between the source electrode and the pixel electrode, the channel length of the thin film transistor is equivalent to the thickness of the active layer, and the channel length of the is reduced by reasonably reducing the thickness of the active layer, thereby increasing the on-state current in the thin film transistor, and improving the property of the TFT array substrate and the display effect of the liquid crystal display. During the process of amplifying the on-state current, the aperture ratio is not reduced, and can even be increased to a certain extent.

While the foregoing is merely a preferred embodiment of the invention, it should be noted that those skilled in the art can make improvements and modifications without departing from the principles of the invention. These improvements and modifications should be regarded within the scope of the present invention.

What is claimed is:

1. A TFT array substrate, comprising:
   a glass substrate;
   a buffer layer bonded to an upper surface of the glass substrate, wherein a first source hole is formed in the buffer layer;
   a source electrode disposed in the first source hole;
   a passivation layer bonded to an upper surface of the buffer layer, wherein a second source hole is formed in the passivation layer, and is positioned directly over the first source hole, and the source electrode extends into the second source hole;
   a gate electrode bonded to an upper surface of the passivation layer;
   a gate insulating layer bonded to the upper surface of the passivation layer and an upper surface of the gate electrode, wherein an active layer mounting hole is formed in the gate insulating layer and positioned directly over the second source hole;
   an active layer disposed in the active layer mounting hole of the gate insulating layer; and
   a pixel electrode bonded to an upper surface of the gate insulating layer and an upper surface of the active layer.

2. The TFT array substrate as claimed in claim 1, wherein a shape of the source electrode corresponds to a shape of the first source hole and the second source hole.

3. The TFT array substrate as claimed in claim 1, wherein a shape of the active layer corresponds to a shape of the active layer mounting hole.

4. The TFT array substrate as claimed in claim 1, wherein the gate insulating layer is coated on the upper surface and a side surface of the gate electrode.

5. The TFT array substrate as claimed in claim 1, wherein at least one data line is embedded in the buffer layer and connected to the source electrode.

6. The TFT array substrate as claimed in claim 1, wherein at least a source and/or drain line is embedded in the active layer, and connected to the source electrode and/or the pixel electrode.

7. The TFT array substrate as claimed in claim 1, wherein the active layer is made of amorphous silicon, IGZO, or polycrystalline silicon.

8. The TFT array substrate as claimed in claim 1, wherein the pixel electrode is an ITO electrode or a MoTi electrode.

9. A display device comprising a TFT array substrate as claimed in claim 1.

10. A method of manufacturing a TFT array substrate, comprising steps of:
    providing a glass substrate;
    disposing a buffer layer bonded to an upper surface of the glass substrate, wherein a first source hole is formed in the buffer layer;
    disposing a source electrode in the first source hole;
    disposing a passivation layer bonded to an upper surface of the buffer layer, wherein a second source hole is formed in the passivation layer, and is positioned directly over the first source hole, and the source electrode extends into the second source hole;
    disposing a gate electrode bonded to an upper surface of the passivation layer;
    disposing a gate insulating layer bonded to the upper surface of the passivation layer and an upper surface of the gate electrode, wherein an active layer mounting hole is formed in the gate insulating layer and positioned directly over the second source hole;
    disposing an active layer in the active layer mounting hole;
    disposing a pixel electrode bonded to an upper surface of the gate insulating layer and an upper surface of the active layer.

11. The method for manufacturing the TFT array substrate as claimed in claim 10, wherein in the step of disposing the buffer layer on the glass substrate, at least one data line is embedded in the buffer layer.

12. The method for manufacturing the TFT array substrate as claimed in claim 10, wherein in the step of disposing an active layer in the active layer mounting hole, at least a source line is embedded in the active layer, and connected to the source electrode.

13. The method of manufacturing the TFT array substrate as claimed in claim 10, wherein in the step of disposing an active layer in the active layer mounting hole, at least a drain line is embedded in the active layer, and in the step of disposing a pixel electrode, the pixel electrode is connected to the drain line.

* * * * *